(12) United States Patent
Kamada et al.

(10) Patent No.: US 10,192,964 B2
(45) Date of Patent: Jan. 29, 2019

(54) COMPOUND SEMICONDUCTOR DEVICE AND METHOD OF MANUFACTURING THE SAME

(71) Applicant: FUJITSU LIMITED, Kawasaki-shi, Kanagawa (JP)

(72) Inventors: Youichi Kamada, Yamato (JP); Shirou Ozaki, Yamato (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/617,133

(22) Filed: Jun. 8, 2017

(65) Prior Publication Data

US 2018/0019311 A1  Jan. 18, 2018

(30) Foreign Application Priority Data

Jul. 12, 2016 (JP) ................................ 2016-137828

(51) Int. Cl.
*H01L 29/00* (2006.01)
*H01L 29/40* (2006.01)
(Continued)

(52) U.S. Cl.
CPC ...... *H01L 29/408* (2013.01); *H01L 23/49562* (2013.01); *H01L 23/66* (2013.01); *H01L 29/2003* (2013.01); *H01L 29/205* (2013.01); *H01L 29/402* (2013.01); *H01L 29/42316* (2013.01); *H01L 29/66462* (2013.01); *H01L 29/7787* (2013.01); *H02M 5/458* (2013.01); (Continued)

(58) Field of Classification Search
None
See application file for complete search history.

(56) References Cited

U.S. PATENT DOCUMENTS

2006/0065911 A1   3/2006   Twynam
2009/0250723 A1  10/2009   Twynam
(Continued)

FOREIGN PATENT DOCUMENTS

JP   2006-128646   5/2006
JP   2009-026838   2/2009
(Continued)

OTHER PUBLICATIONS

USPTO, [Yemelyanov], Non-Final Rejection dated Jul. 26, 2018 in related U.S. Appl. No. 15/619,679 [pending].

*Primary Examiner* — Reema Patel
(74) *Attorney, Agent, or Firm* — Fujitsu Patent Center

(57) ABSTRACT

A compound semiconductor device includes: a carrier transit layer; a carrier supply layer over the carrier transit layer; a source electrode and a drain electrode above the carrier supply layer; a gate electrode above the carrier supply layer between the source electrode and the drain electrode; and a first insulating film, a second insulating film, and a third insulating film above the carrier supply layer between the gate electrode and the drain electrode. The gate electrode includes a portion above the third insulating film, a first concentration of electron traps in the first insulating film is higher than a second concentration of electron traps in the second insulating film, and a third concentration of electron traps in the third insulating film is higher than the second concentration of the electron traps in the second insulating film.

10 Claims, 15 Drawing Sheets

(51) Int. Cl.

| | |
|---|---|
| *H01L 23/495* | (2006.01) |
| *H01L 29/20* | (2006.01) |
| *H01L 29/205* | (2006.01) |
| *H01L 29/66* | (2006.01) |
| *H01L 29/778* | (2006.01) |
| *H02M 5/458* | (2006.01) |
| *H03F 1/32* | (2006.01) |
| *H03F 3/193* | (2006.01) |
| *H03F 3/21* | (2006.01) |
| *H01L 29/423* | (2006.01) |
| *H01L 23/66* | (2006.01) |
| *H03F 3/195* | (2006.01) |
| *H02M 1/42* | (2007.01) |
| *H02M 3/337* | (2006.01) |

(52) U.S. Cl.
CPC ......... *H03F 1/3241* (2013.01); *H03F 1/3247* (2013.01); *H03F 3/193* (2013.01); *H03F 3/195* (2013.01); *H03F 3/21* (2013.01); *H02M 1/4225* (2013.01); *H02M 3/337* (2013.01); *H03F 2200/204* (2013.01); *H03F 2200/451* (2013.01)

(56) References Cited

U.S. PATENT DOCUMENTS

| | | |
|---|---|---|
| 2010/0327322 A1 | 12/2010 | Kub et al. |
| 2014/0264451 A1 | 9/2014 | Ozaki et al. |
| 2014/0346526 A1 | 11/2014 | Kanamura |
| 2016/0056274 A1 | 2/2016 | Kawaguchi |
| 2018/0019333 A1* | 1/2018 | Kamada ............ H01L 29/66462 |

FOREIGN PATENT DOCUMENTS

| | | |
|---|---|---|
| JP | 2014-229879 | 12/2014 |
| JP | 2015-012037 | 1/2015 |

* cited by examiner

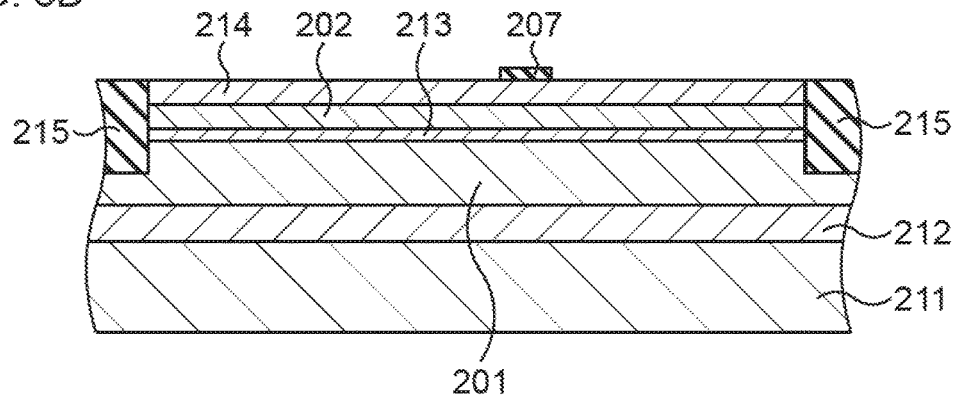
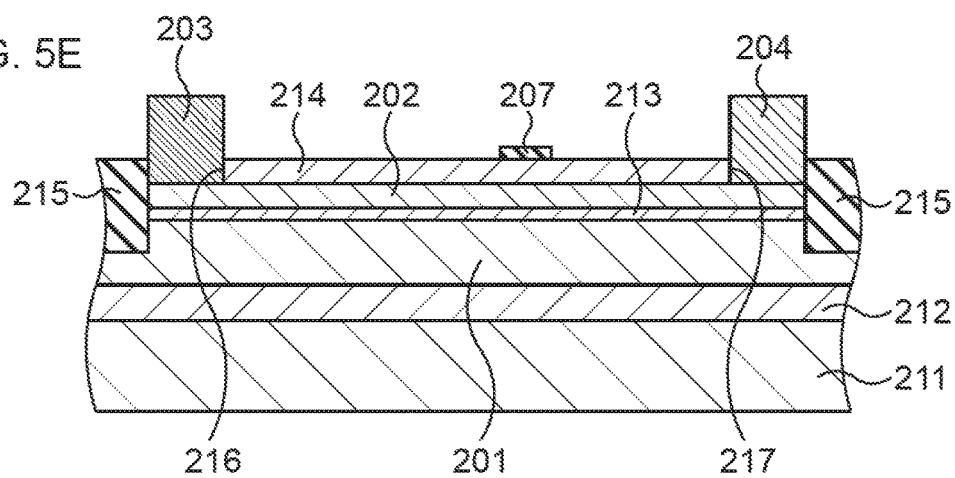
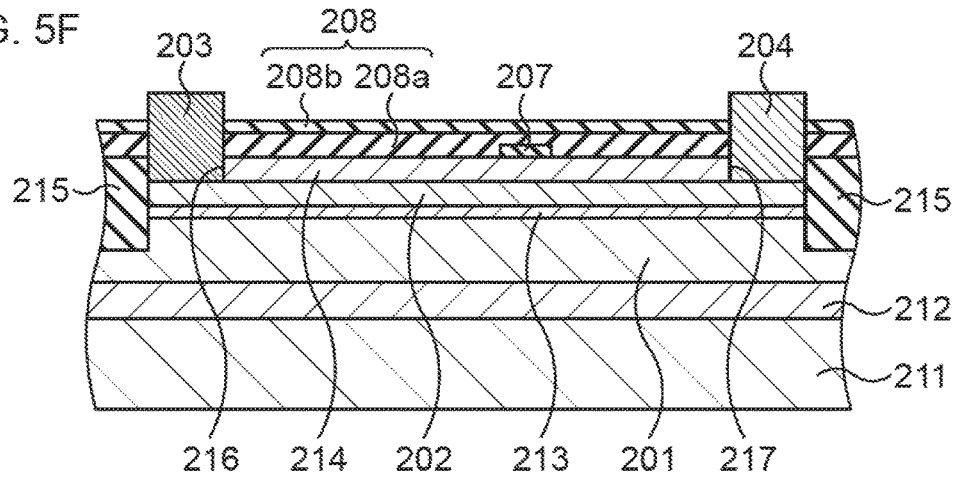

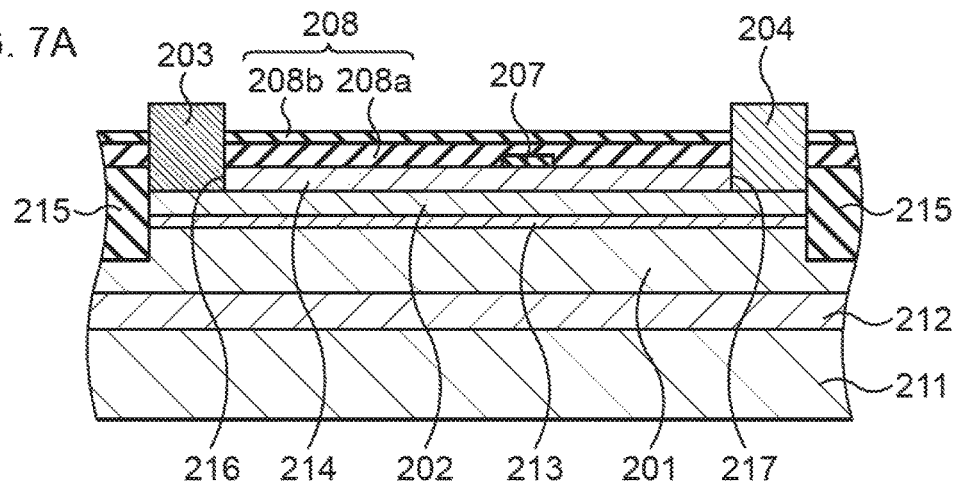
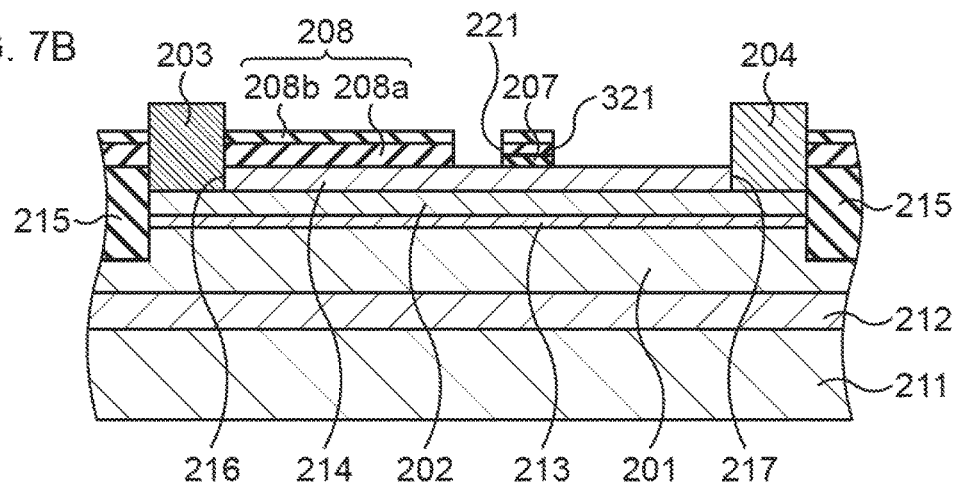
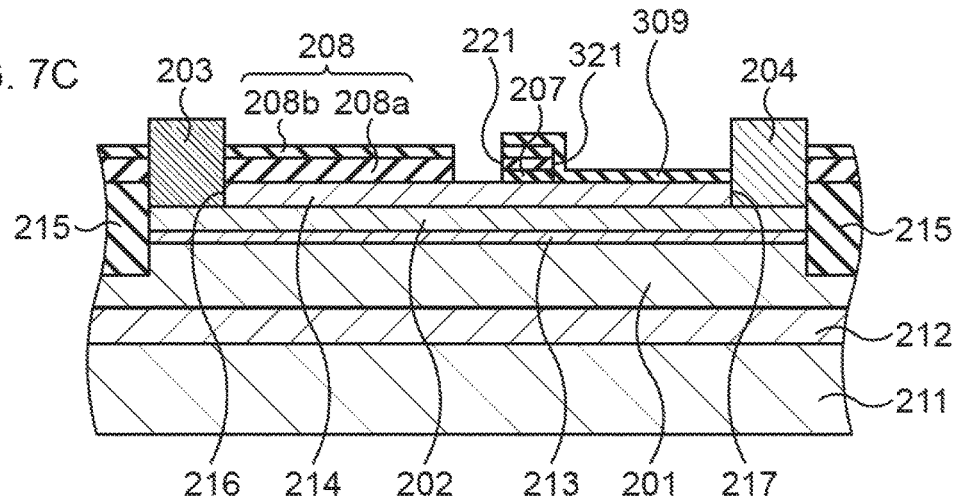

COMPOUND SEMICONDUCTOR DEVICE AND METHOD OF MANUFACTURING THE SAME

CROSS-REFERENCE TO RELATED APPLICATION

This application is based upon and claims the benefit of priority of the prior Japanese Patent Application No. 2016-137828, filed on Jul. 12, 2016, the entire contents of which are incorporated herein by reference.

FIELD

The embodiments discussed herein are directed to a compound semiconductor device and a method of manufacturing the same.

BACKGROUND

A nitride semiconductor has characteristics such as high saturation electron velocity and a wide band gap. Accordingly, various studies are being made on the application of a nitride semiconductor to a high withstand voltage and high output semiconductor device utilizing the characteristics. For example, GaN-based high electron mobility transistors (HEMT) have recently been used as power devices.

Some GaN-based HEMT includes a gate electrode having what is called a T-shaped structure. This GaN-based HEMT can have a reduced gate resistance while having a shortened gate length.

In a conventional GaN-based HEMT including the T-shaped gate electrode, however, an electric field is likely to concentrate near a drain electrode side end portion of an eaves-shaped portion as described also in Patent Document 2. An art to alleviate such electric field concentration is described in Patent Document 2, but this art has a problem of difficulty in obtaining excellent high-frequency characteristics even though capable of attaining the end desired.

Patent Document 1: Japanese Laid-open Patent Publication No. 2014-229879

Patent Document 2: Japanese Laid-Open Patent Publication No. 2015-12037

SUMMARY

According to an aspect of the embodiments, a compound semiconductor device includes: a carrier transit layer; a carrier supply layer over the carrier transit layer; a source electrode and a drain electrode above the carrier supply layer; a gate electrode above the carrier supply layer between the source electrode and the drain electrode; and a first insulating film, a second insulating film, and a third insulating film above the carrier supply layer between the gate electrode and the drain electrode. The gate electrode includes a portion above the third insulating film, a first concentration of electron traps in the first insulating film is higher than a second concentration of electron traps in the second insulating film, and a third concentration of electron traps in the third insulating film is higher than the second concentration of the electron traps in the second insulating film.

According to another aspect of the embodiments, a method of manufacturing a compound semiconductor device includes: forming a carrier supply layer over a carrier transit layer; forming a source electrode and a drain electrode above the carrier supply layer; forming a gate electrode above the carrier supply layer between the source electrode and the drain electrode; and forming a first insulating film, a second insulating film, and a third insulating film above the carrier supply layer between the gate electrode and the drain electrode. The gate electrode includes a portion above the third insulating film, a first concentration of electron traps in the first insulating film is higher than a second concentration of electron traps in the second insulating film, and a third concentration of electron traps in the third insulating film is higher than the second concentration of the electron traps in the second insulating film.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 5A to FIG. 5J are process-by-process sectional views illustrating a method of manufacturing the compound semiconductor device according to the second embodiment;

FIG. 7A to FIG. 7E are process-by-process sectional views illustrating a method of manufacturing the compound semiconductor device according to the third embodiment;

DESCRIPTION OF EMBODIMENTS

The inventors of the present application have conducted studious studies to solve the aforesaid problem. As a result, it has been found out that, in the art described in Patent Document 2, large parasitic capacitance is present due to an aluminum oxide film formed between the eaves-shaped portion of the gate electrode and a channel, and this parasitic capacitance prevents an improvement of the high-frequency characteristics. It is possible to reduce the parasitic capacitance by increasing the distance between the eaves portion of the gate electrode and the channel, but thickening the aluminum oxide film accordingly increases an amount of OH groups included in the aluminum oxide film, leading to a large variation of a threshold value to lower reliability.

Embodiments will be hereinafter concretely described with reference to the accompanying drawings.

(First Embodiment)

Figure 1:
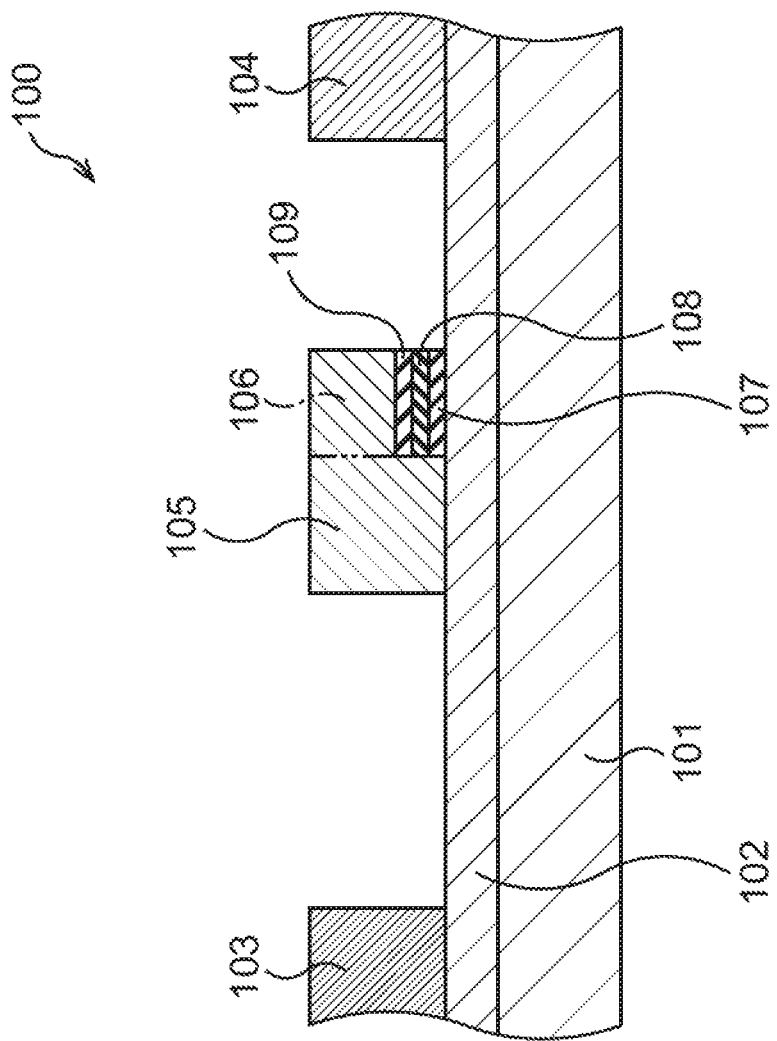
FIG. 1 is a sectional view illustrating a structure of the compound semiconductor device according to the first embodiment.

First, a first embodiment will be described. The first embodiment relates to an example of a compound semiconductor device including HEMT. FIG. 1 is a sectional view illustrating a structure of the compound semiconductor device according to the first embodiment.

As illustrated in FIG. 1, the compound semiconductor device 100 according to the first embodiment includes a carrier transit layer 101, a carrier supply layer 102 over the carrier transit layer 101, and a source electrode 103 and a drain electrode 104 above the carrier supply layer 102. The compound semiconductor device 100 also includes a gate electrode 105 above the carrier supply layer 102 between the source electrode 103 and the drain electrode 104, and a first insulating film 107, a second insulating film 108 and a third insulating film 109 above the carrier supply layer 102 between the gate electrode 105 and the drain electrode 104. A concentration of electron traps in the first insulating film 107 is higher than a concentration of electron traps in the second insulating film 108, and a concentration of electron traps in the third insulating film 109 is higher than the concentration of the electron traps in the second insulating film 108. The gate electrode 105 includes a portion 106 above the third insulating film 109.

Figure 2:
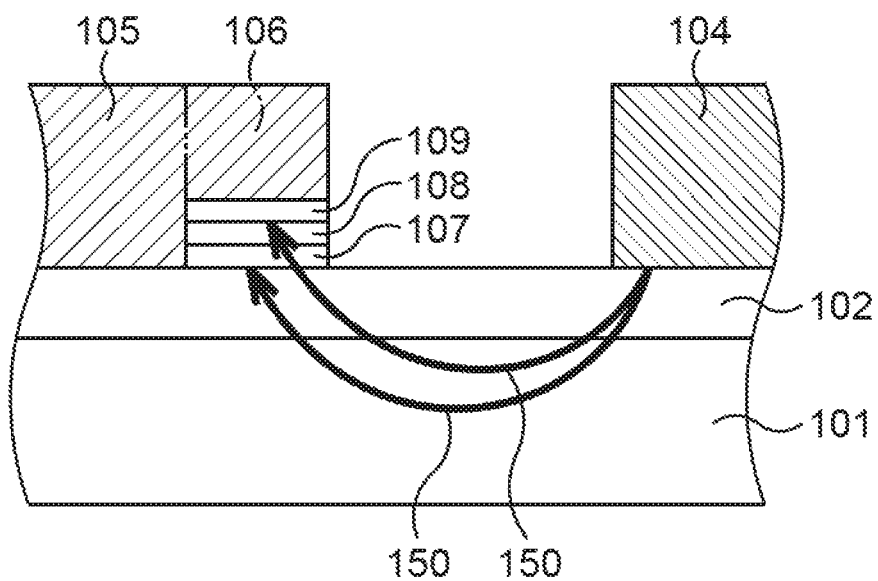
FIG. 2 is a sectional view illustrating a function of the compound semiconductor device according to the first embodiment.

In the compound semiconductor device 100 according to the first embodiment, electric lines of force 150 from the drain electrode 104 are terminated by the electron traps in the first insulating film 107 and the electron traps in the third insulating film 109, as illustrated in FIG. 2. Thus, electric field concentration can be relaxed near a drain electrode 104 side end portion of the gate electrode 105, and a gate leakage current can be reduced. In addition, since the second insulating film 108 is between the first insulating film 107 and the third insulating film 109, parasitic capacitance between two-dimensional electron gas (2DEG), which is generated in a region of the carrier transit layer 101 near the carrier supply layer 102, and the eaves-shaped portion 106 can be reduced even if the first insulating film 107 and the third insulating film 109 are not thick. This can achieve excellent high-frequency characteristics. Moreover, since the concentration of the electron traps in the second insulating film 108 is lower than the concentration of the electron traps in the first insulating film 107 and the concentration of the electron traps in the third insulating film 109, the threshold value variation caused by the electron traps can be suppressed.

Whether the concentration of electron traps contained in an insulating film is high or low can be determined based on, for example, an electric resistance of the insulating film. The electric resistance of the insulating film can be measured using a probe in an electron microscope, for instance. An insulating film having a high electron trap concentration has a low electric resistance, and an insulating film having a low electron trap concentration has a high electric resistance. In the compound semiconductor device 100 according to the first embodiment, since the concentration of the electron traps in the second insulating film 108 is lower than the concentration of the electron traps in the first insulating film 107 or the third insulating film 109, the electric resistance of the second insulating film 108 is higher than the electric resistance of the first insulating film 107 or the third insulating film 109. Another method to determine whether the concentration of the electron traps contained in the insulating film is high or low is, for example, to observe the state of the insulating film after it is wet-etched. As the insulating film has a higher electron trap concentration, the wet-etching rate thereof is lower.

(Second Embodiment)

Figure 3:
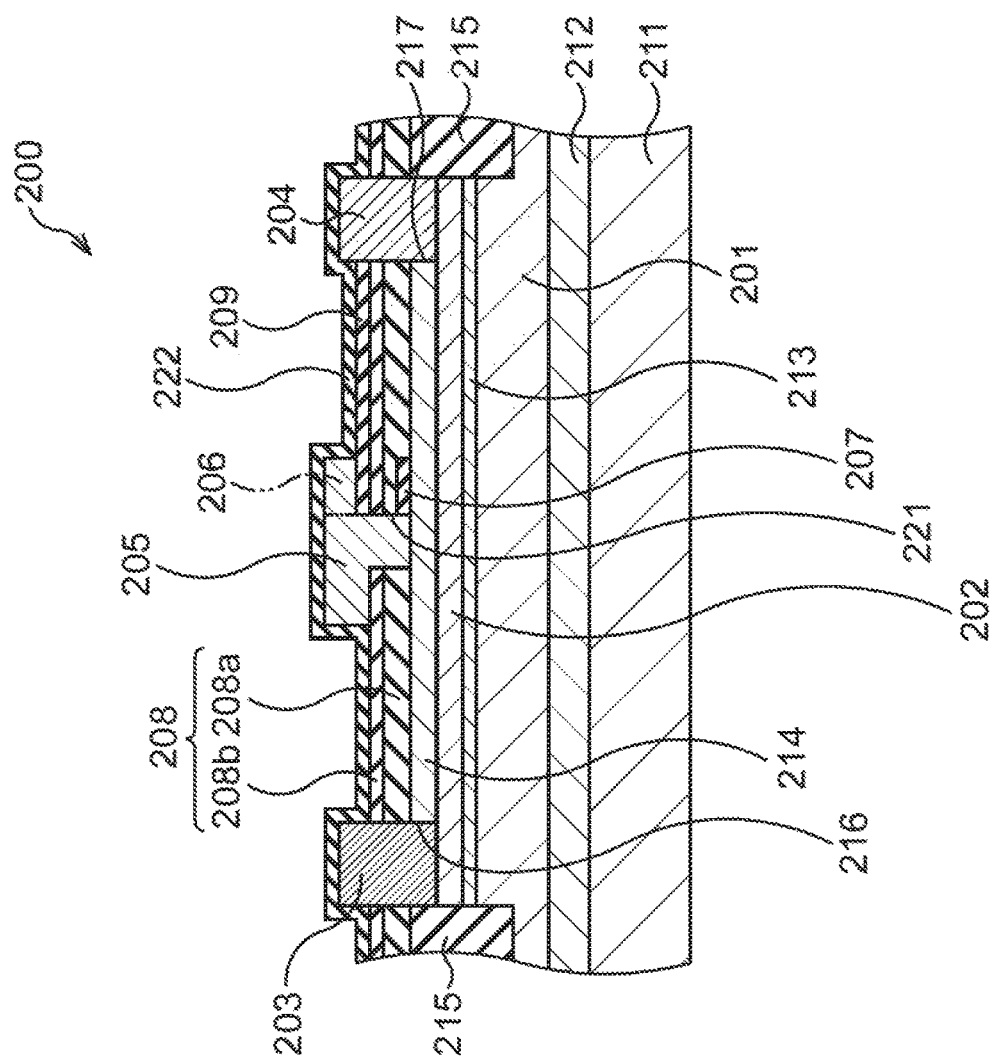
FIG. 3 is a sectional view illustrating a structure of a compound semiconductor device according to a second embodiment.

Next, a second embodiment will be described. The second embodiment is an example of a compound semiconductor device including a GaN-based HEMT. FIG. 3 is a sectional view illustrating a structure of the compound semiconductor device according to the second embodiment.

As illustrated in FIG. 3, the compound semiconductor device 200 according to the second embodiment includes a substrate 211, a buffer layer 212 on the substrate 211, and a carrier transit layer 201 on the buffer layer 212. The compound semiconductor device 200 also includes a spacer layer 213 on the carrier transit layer 201, a carrier supply layer 202 on the spacer layer 213, a cap layer 214 on the carrier supply layer 202.

The substrate 211 is, for example, a SiC substrate. The buffer layer 212 is, for example, an AlGaN layer. The buffer layer 212 optionally includes a superlattice structure. The carrier transit layer 201 is, for example, a GaN layer (i-GaN layer) having an about 3 μm thickness and not containing intentionally doped impurities. The spacer layer 213 is, for example, an AlGaN layer (i-AlGaN layer) having an about 5 nm thickness and not containing intentionally doped impurities. The carrier supply layer 202 is, for example, an n-type AlGaN layer (n-AlGaN layer) having an about 30 nm thickness. The cap layer 214 is, for example, an n-type GaN layer (n-GaN layer) having an about 10 nm thickness. The carrier supply layer 202 and the cap layer 214 are doped with, for example, Si with an about $5 \times 10^{18}$ cm$^{-3}$ concentration.

An element isolation region 215 demarcating an element region is formed in a stack of the carrier transit layer 201, the spacer layer 213, the carrier supply layer 202, and the cap layer 214. In the element region, an opening 216 and an opening 217 are formed in the cap layer 214, a source electrode 203 is formed in the opening 216, and a drain electrode 204 is formed in the opening 217.

A second insulating film 208 is formed above the cap layer 214 between the source electrode 203 and the drain electrode 204. The second insulating film 208 includes, for example, a silicon nitride film 208a and a silicon oxynitride film 208b thereon. In the insulating film 208, an opening 221 is formed between the source electrode 203 and the drain electrode 204, and on the drain electrode 204 side of the opening 221, a third insulating film 209 is formed on the insulating film 208. The insulating film 209 is, for example, an aluminum oxide film. A gate electrode 205 in Schottky contact with the cap layer 214 is formed through the opening 221. The gate electrode 205 has what is called a T-shaped structure and includes an eaves-shaped portion 206 on the insulating film 209. A first insulating film 207 is formed under the portion 206 between the cap layer 214 and the insulating film 208. The insulating film 207 is, for example, an aluminum oxide film. The insulating film 207 and the insulating film 209 each contain aluminum hydroxide. Regarding a ratio R of a number $N_{Al(OH)x}$ of oxygen atoms contained in aluminum hydroxide (Al(OH)$_x$) to a number $N_{Al-o-Al}$ of oxygen atoms that form an Al—O—Al bond out of oxygen atoms in the insulating film, a ratio R in the insulating film 209 is higher than a ratio R in the insulating film 207. For example, the ratio R in the insulating film 207 is about 0.04 to about 0.08, and the ratio R in the insulating film 209 is about 0.10 to about 0.14. A concentration of electron traps in the insulating film 207 is higher than a concentration of electron traps in the insulating film 208, and a concentration of electron traps in the insulating film 209 is higher than the concentration of the electron traps in the insulating film 208. A protective film 222 that covers the gate electrode 205 is formed on the insulating film 209. For example, the thickness of the insulating film 207 is about 1 nm to about 100 nm, the thickness of the insulating film 209 is about 1 nm to 100 nm, the thickness of the silicon nitride film 208a is about 1 nm to about 100 nm, and the thickness of the silicon oxynitride film 208b is about 1 nm to about 100 nm.

Figure 4:
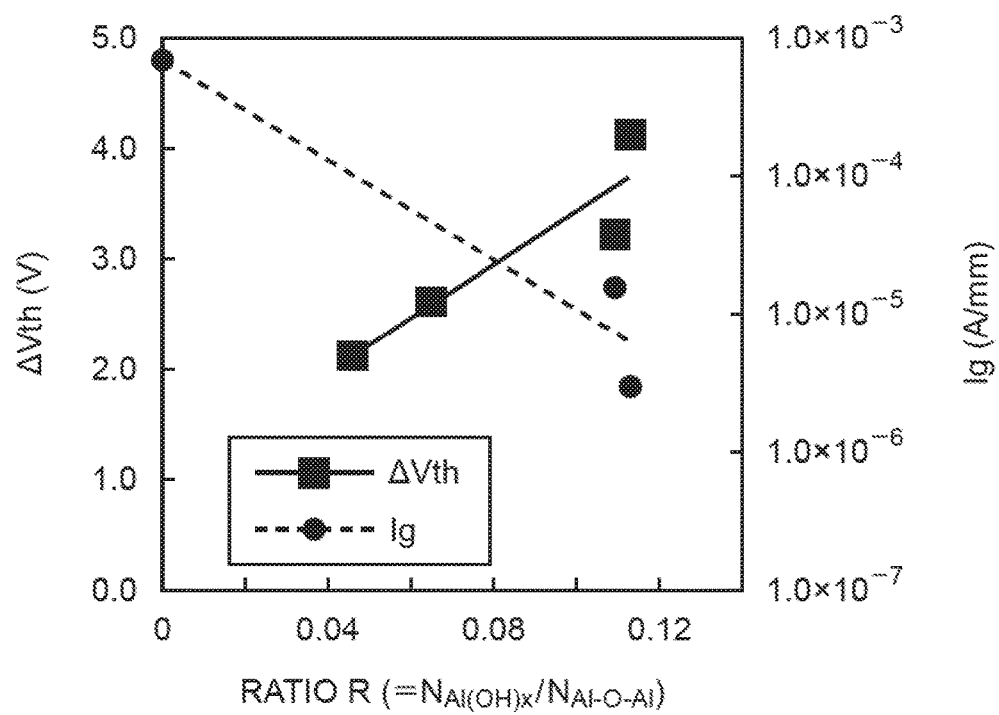
FIG. 4 is a graph representing how a ratio R of a number of oxygen atoms to a number of oxygen atoms in an aluminum oxide film correlates with a threshold voltage variation and with a gate leakage current.

The second embodiment can also provide the same effect as that of the first embodiment. The second embodiment can relax the electric field concentration more, owing to the insulating film 209 formed in a wider range. According to the second embodiment, the effect of reducing the gate leakage current and the effect of reducing the threshold voltage variation can be better-balanced. FIG. 4 is a graph representing how a ratio R of a number $N_{Al(OH)_x}$ of oxygen atoms to a number $N_{Al-O-Al}$ of oxygen atoms in an aluminum oxide film correlates with the threshold voltage variation ($\Delta$th) and with the gate leakage current (Ig) when a gate voltage is −50 V. It is seen from FIG. 4 that the gate leakage current is lower as the ratio R is higher, and the threshold voltage variation is reduced more as the ratio R is lower. Further, the threshold voltage variation is likely to be influenced by the electron traps in a part near 2DEG. Therefore, in the second embodiment, the insulating film 207 is effective to reduce the threshold voltage variation, while the insulating film 209 is effective to reduce the gate leakage current, and these effects are well-balanced.

Next, a method of manufacturing the compound semiconductor device according to the second embodiment will be described. FIG. 5A to FIG. 5J are process-by-process sectional views illustrating the method of manufacturing the compound semiconductor device according to the second embodiment.

Figure 5A:
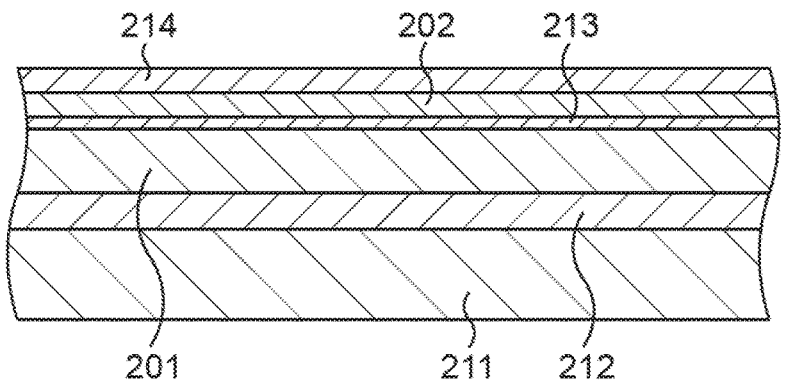

First, as illustrated in FIG. 5A, the buffer layer 212, the carrier transit layer 201, the spacer layer 213, the carrier supply layer 202, and the cap layer 214 are formed on the substrate 211. The buffer layer 212, the carrier transit layer 201, the spacer layer 213, the carrier supply layer 202, and the cap layer 214 may be formed by, for example, a metal organic vapor phase epitaxy (MOVPE) method.

In forming these compound semiconductor layers, mixed gas of, for example, trimethylaluminum (TMA) gas as an Al source, trimethylgallium (TMG) gas as a Ga source, and ammonia ($NH_3$) gas as a N source is used. At this time, depending on the composition of the compound semiconductor layer to be grown, whether to supply the trimethylaluminum gas and the trimethylgallium gas or not, and a flow rate are appropriately controlled. The flow rate of the ammonia gas as a material commonly used for the compound semiconductor layers is about 100 ccm to about 10 LM, for instance. For example, growth pressure is about 50 Torr to about 300 Torr, and growth temperature is about 1000° C. to about 1200° C. When the n-type compound semiconductor layer (for example, the carrier supply layer 202 and the cap layer 214) is grown, for example, $SiH_4$ gas containing Si is added to the mixed gas at a specific flow rate to dope the compound semiconductor layer with Si. The doping concentration of Si is set to about $1\times10^{18}$ cm$^{-3}$ to about $1\times10^{20}$ cm$^{-3}$, for example, about $5\times10^{18}$ cm$^{-3}$.

Figure 5B:
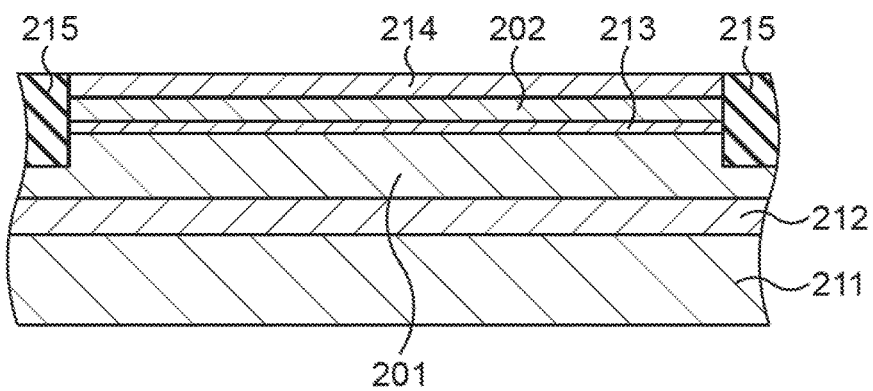

Then, as illustrated in FIG. 5B, the element isolation region 215 demarcating the element region is formed in the cap layer 214, the carrier supply layer 202, the spacer layer 213, and the carrier transit layer 201. In forming the element isolation region 215, for example, a photoresist pattern from which the region where the element isolation region 215 is to be formed is exposed is formed on the cap layer 214, and ions of, for example, Ar are injected with this pattern as a mask. Dry etching using chlorine-based gas may be performed with this pattern as an etching mask.

Figure 5C:
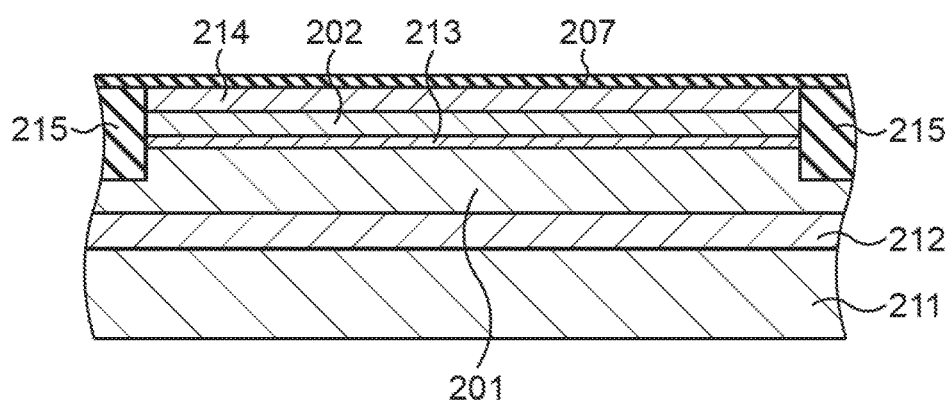

Thereafter, as illustrated in FIG. 5C, the first insulating film 207 is formed on the cap layer 214. As the insulating film 207, for example, an aluminum oxide film whose ratio R is about 0.04 to about 0.08 is formed by atomic layer deposition (ALD). The ratio R may be adjusted by controlling a flow rate ratio of trimethylaluminum (TMA) or $H_2O$ in the film forming.

Subsequently, as illustrated in FIG. 5D, the insulating film 207 is patterned by wet etching.

Then, as illustrated in FIG. 5E, the opening 216 and the opening 217 are formed in the cap layer 214, the source electrode 203 is formed in the opening 216, and the drain electrode 204 is formed in the opening 217. The source electrode 203 and the drain electrode 204 may be formed by, for example, a lift-off method. Specifically, a photoresist pattern from which a region where the source electrode 203 is to be formed and a region where the drain electrode 204 is to be formed and which covers the other region is formed, a metal film is formed by a vapor deposition method with this pattern as a growth mask, and this pattern is removed together with the metal film thereon. In forming the metal film, for example, an Al film is formed after a Ti film is formed. Then, heat treatment is performed at 400° C. to 900° C. (for example, 580° C.) in a nitrogen atmosphere to obtain ohmic characteristics.

Thereafter, as illustrated in FIG. 5F, the second insulating film 208 that includes the silicon nitride film 208a and the silicon oxynitride film 208b thereon is formed. The insulating film 208 may be formed by, for example, a chemical vapor deposition (CVD) method, an atomic layer deposition (ALD) method, or a sputtering method.

Figure 5G:
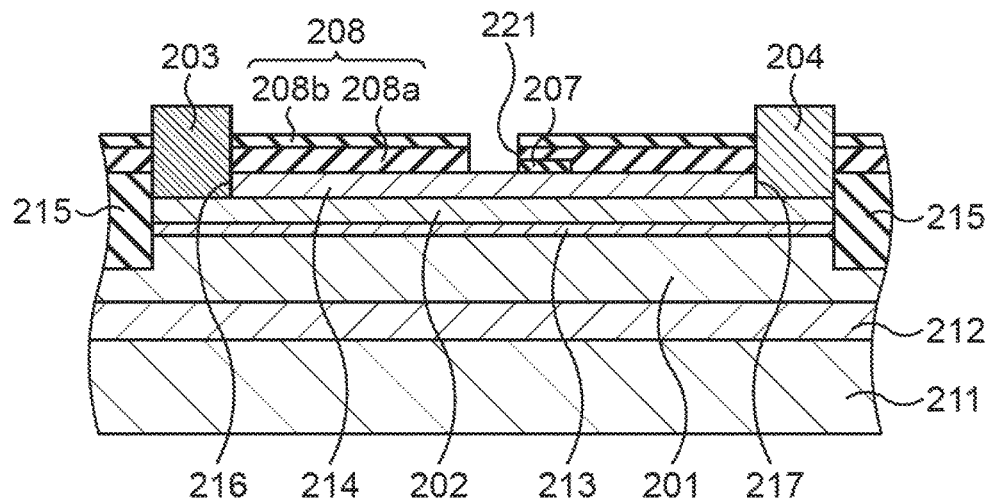

Subsequently, as illustrated in FIG. 5G, the opening 221 is formed in a region of the insulating film 210 where the gate electrode 205 is to be formed. The opening 221 may be formed by, for example, dry etching. The opening 221 may be formed by wet etching or ion milling.

Figure 5H:
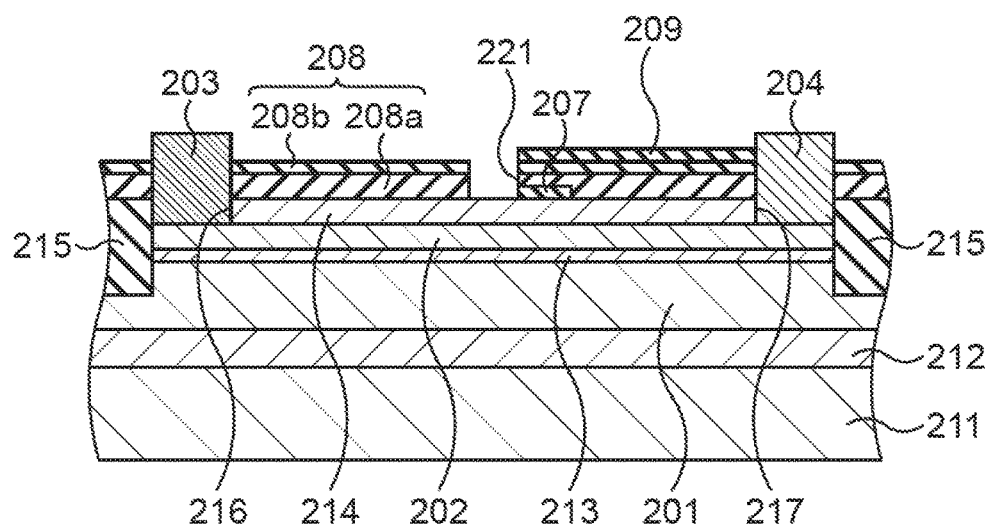

Then, as illustrated in FIG. 5H, the third insulating film 209 is formed on the insulating film 208 on a drain electrode 204 side of the opening 221. As the insulating film 209, an aluminum oxide film whose ratio R is about 0.10 to about 0.14 is formed by atomic layer deposition (ALD), for instance.

Figure 5I:
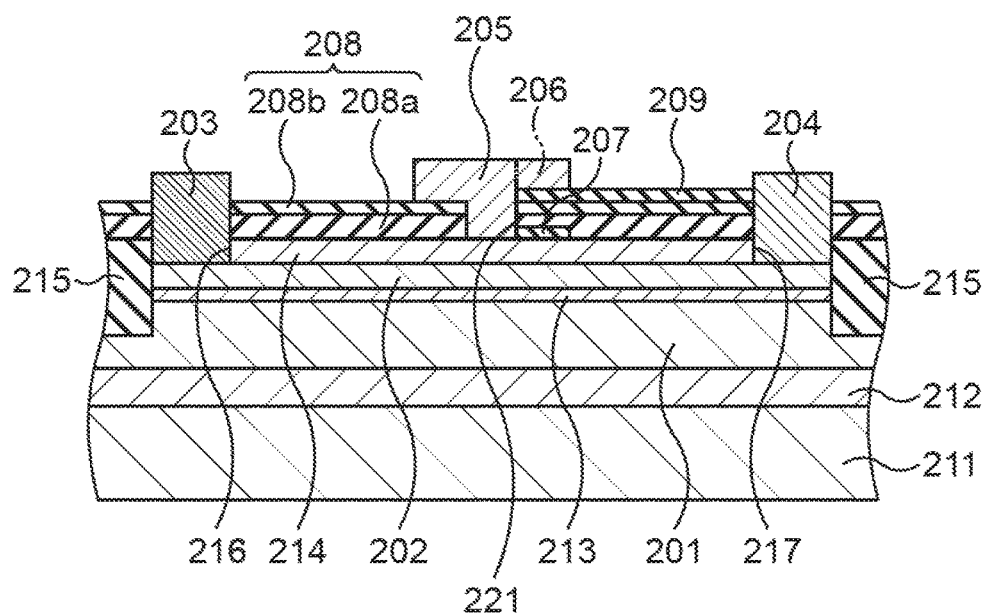

Thereafter, as illustrated in FIG. 5I, the gate electrode 205 including the eaves-shaped portion 206 on the insulating film 209 is formed. The gate electrode 205 may be formed by, for example, a lift-off method. Specifically, a photoresist pattern from which a region where the gate electrode 205 is to be formed is exposed is formed, a metal film is formed by a vapor deposition method with this pattern as a growth mask, and this pattern is removed together with the metal film thereon. In forming the metal film, for example, a Au film is formed after a Ni film is formed.

Figure 5J:
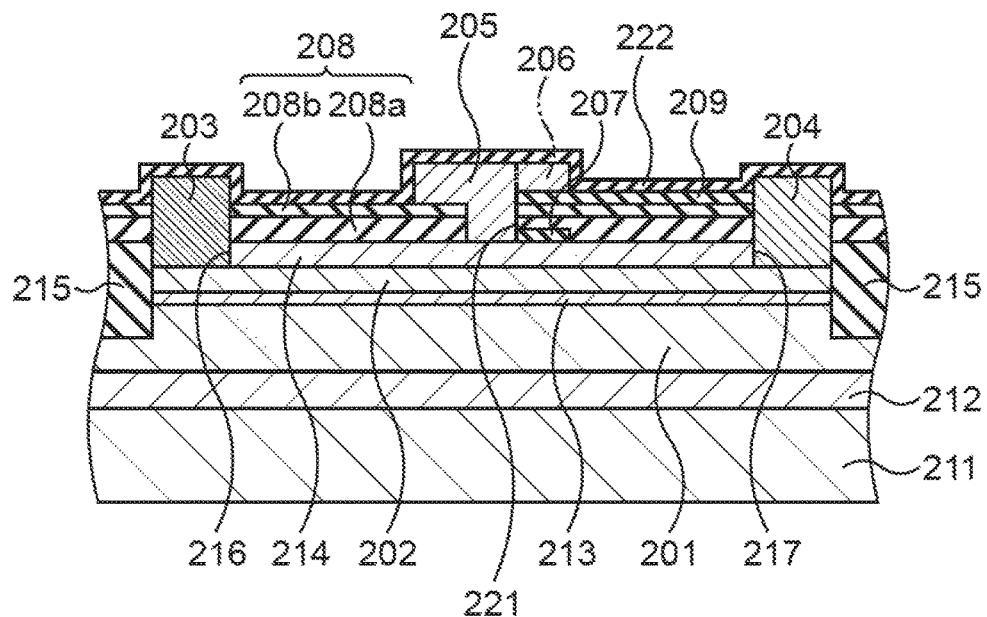

Thereafter, as illustrated in FIG. 5J, the protective film 222 that covers the gate electrode 205 is formed. The protective film 222 is formed on the insulating film 208 on the source electrode 203 side of the the gate electrode 205, and on the insulating film 209 on the drain electrode 204 side of the gate electrode 205. The protective film 222 may be formed by, for example, a CVD method, an ALD method, or a sputtering method.

Then, a protective film, wiring, and others are formed as required to complete the compound semiconductor device.

(Third Embodiment)

Figure 6:
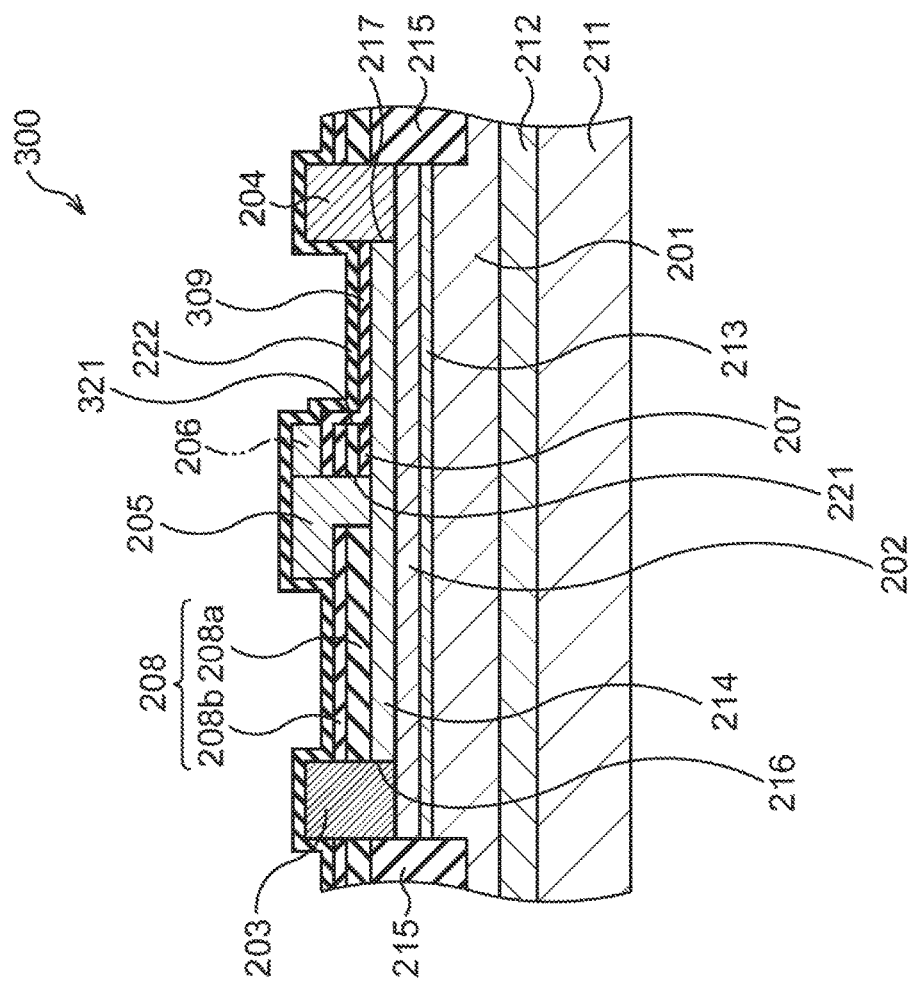
FIG. 6 is a sectional view illustrating a structure of a compound semiconductor device according to a third embodiment.

Next, a third embodiment will be described. The third embodiment is an example of a compound semiconductor device including a GaN-based HEMT. FIG. 6 is a sectional view illustrating a structure of the compound semiconductor device according to the third embodiment.

In the compound semiconductor device 300 according to the third embodiment, as illustrated in FIG. 6, an opening 321 between an eaves-shaped portion 206 and a drain electrode 204 in planar view is formed in the second insulating film 208. A third insulating film 309 is formed between the eaves-shaped portion 206 and the insulating film 208 and in the opening 321, and the insulating film 309 is in contact with the cap layer 214 in the opening 321. The other structure is the same as that of the second embodiment.

The third embodiment can also provide the same effect as that of the second embodiment. The third embodiment can alleviate the electric field concentration more because the insulating film 309 is formed closer to 2DEG.

Next, a method of manufacturing the compound semiconductor device according to the third embodiment will be described. FIG. 7A to FIG. 7E are process-by-process sectional views illustrating the method of manufacturing the compound semiconductor device according to the third embodiment.

First, as illustrated in FIG. 7A, the processes up to the formation of the second insulating film 208 are performed in the same manner as in the second embodiment. Then, as illustrated in FIG. 7B, the opening 221 and the opening 321 are formed. Thereafter, as illustrated in FIG. 7C, the third insulating film 309 is formed in the opening 321 and on the insulating film 208 on the drain electrode 204 side of the opening 221.

Figure 7D:
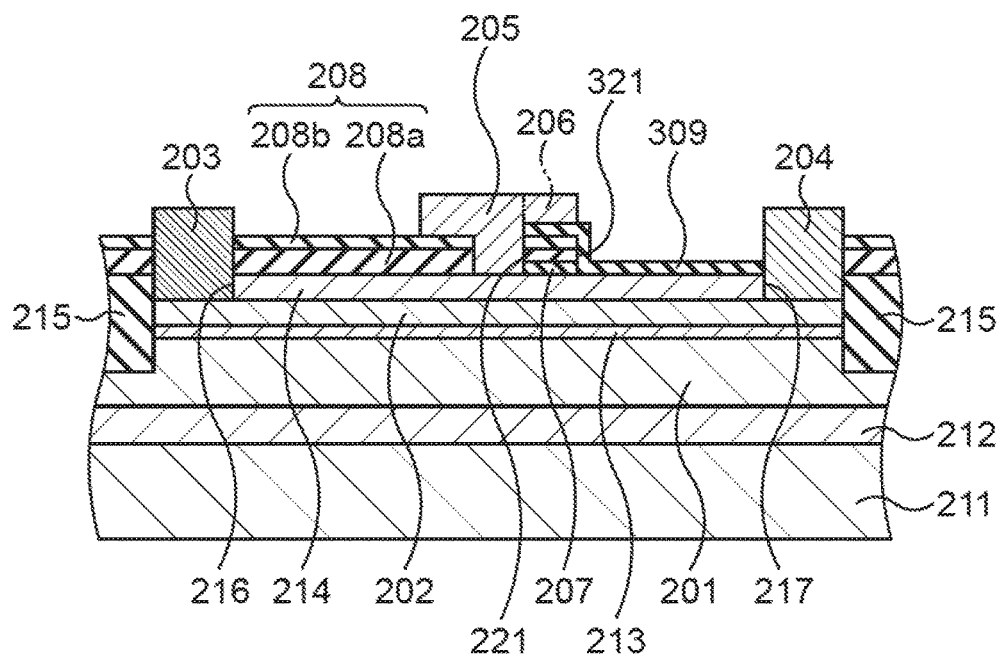
Figure 7E:
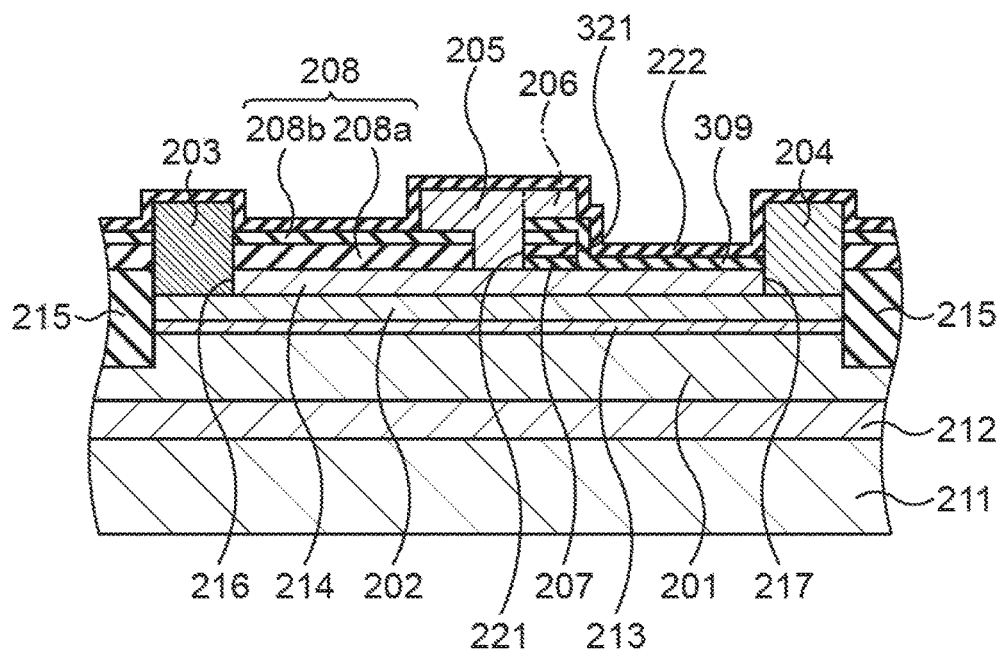

Subsequently, as illustrated in FIG. 7D, the gate electrode 205 including the eaves-shaped portion 206 on the insulating film 309 is formed. Then, as illustrated in FIG. 7E, the protective film 222 that covers the gate electrode 205 is formed. The protective film 222 is formed on the insulating film 208 on the source electrode 203 side of the gate electrode 205, and on the insulating film 209 on the drain electrode 204 side of the gate electrode 205.

Then, a protective film, wiring, and others are formed as required to complete the compound semiconductor device.

(Fourth Embodiment)

Figure 8:
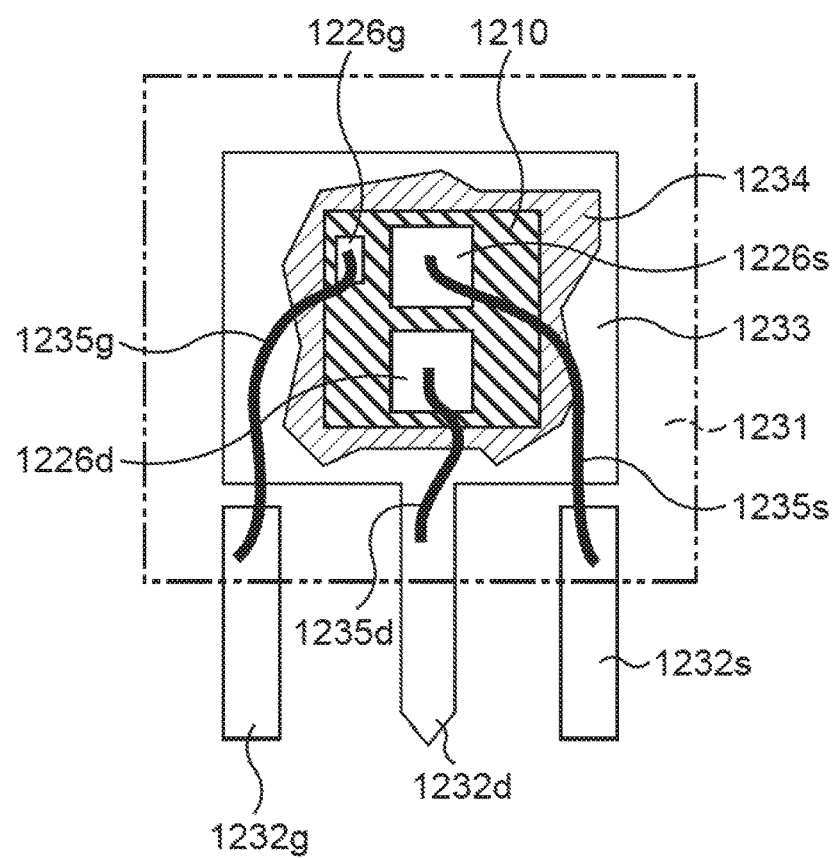
FIG. 8 is a view illustrating a discrete package according to a fourth embodiment.

Next, a fourth embodiment is described. The fourth embodiment relates to a discrete package of a compound semiconductor device which includes a nitride semiconductor HEMT. FIG. 8 is a view illustrating the discrete package according to the fourth embodiment.

In the fourth embodiment, as illustrated in FIG. 8, a back surface of a HEMT chip 1210 of the compound semiconductor device according to any one of the first to third embodiments is fixed on a land (die pad) 1233, using a die attaching agent 1234 such as solder. One end of a wire 1235d such as an Al wire is bonded to a drain pad 1226d, to which the drain electrode 104 or 204 is connected, and the other end of the wire 1235d is bonded to a drain lead 1232d integral with the land 1233. One end of a wire 1235s such as an Al wire is bonded to a source pad 1226s, to which the source electrode 103 or 203 is connected, and the other end of the wire 1235s is bonded to a source lead 1232s separated from the land 1233. One end of a wire 1235g such as an Al wire is bonded to a gate pad 1226g, to which the gate electrode 105 or 205 is connected, and the other end of the wire 1235g is bonded to a gate lead 1232g separated from the land 1233. The land 1233, the HEMT chip 1210 and so forth are packaged with a molding resin 1231, so as to project outwards a portion of the gate lead 1232g, a portion of the drain lead 1232d, and a portion of the source lead 1232s.

The discrete package may be manufactured by the procedures below, for example. First, the HEMT chip 1210 is bonded to the land 1233 of a lead frame, using a die attaching agent 1234 such as solder. Next, with the wires 1235g, 1235d and 1235s, the gate pad 1226g is connected to the gate lead 1232g of the lead frame, the drain pad 1226d is connected to the drain lead 1232d of the lead frame, and the source pad 1226s is connected to the source lead 1232s of the lead frame, respectively, by wire bonding. The molding with the molding resin 1231 is conducted by a transfer molding process. The lead frame is then cut away.

(Fifth Embodiment)

Figure 9:
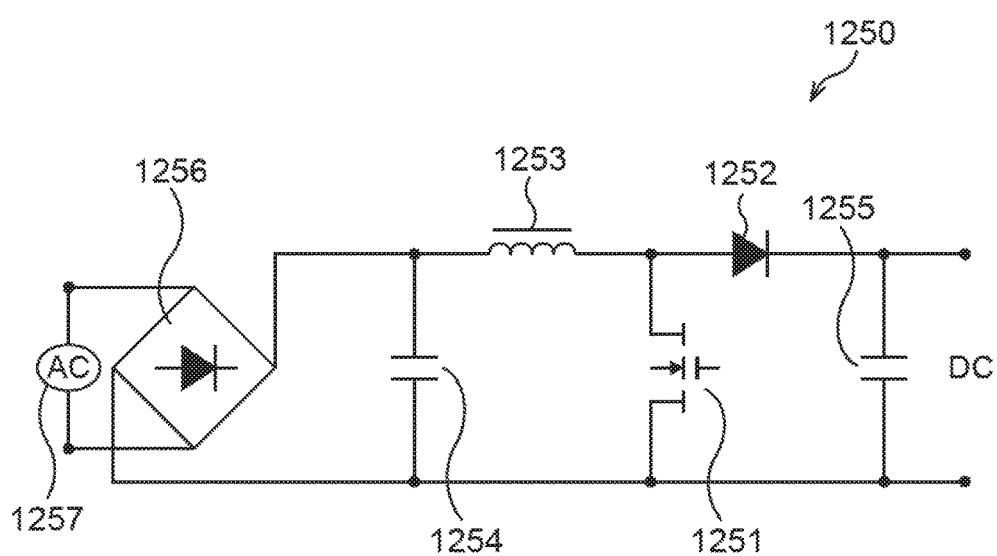
FIG. 9 is a wiring diagram illustrating a PFC circuit according to a fifth embodiment.

Next, a fifth embodiment is described. The fifth embodiment relates to a PFC (power factor correction) circuit equipped with a compound semiconductor device which includes a nitride semiconductor HEMT. FIG. 9 is a wiring diagram illustrating the PFC circuit according to the fifth embodiment.

A PFC circuit 1250 has a switching element (transistor) 1251, a diode 1252, a choke coil 1253, capacitors 1254 and 1255, a diode bridge 1256, and an AC power source (AC) 1257. The drain electrode of the switching element 1251, the anode terminal of the diode 1252, and one terminal of the choke coil 1253 are connected with each other. The source electrode of the switching element 1251, one terminal of the capacitor 1254, and one terminal of the capacitor 1255 are connected with each other. The other terminal of the capacitor 1254 and the other terminal of the choke coil 1253 are connected with each other. The other terminal of the capacitor 1255 and the cathode terminal of the diode 1252 are connected with each other. A gate driver is connected to the gate electrode of the switching element 1251. The AC 1257 is connected between both terminals of the capacitor 1254 via the diode bridge 1256. A DC power source (DC) is connected between both terminals of the capacitor 1255. In the embodiment, the compound semiconductor device according to any one of the first to third embodiments is used as the switching element 1251.

In the method of manufacturing the PFC circuit 1250, for example, the switching element 1251 is connected to the diode 1252, the choke coil 1253 and so forth with solder, for example.

(Sixth Embodiment)

Figure 10:
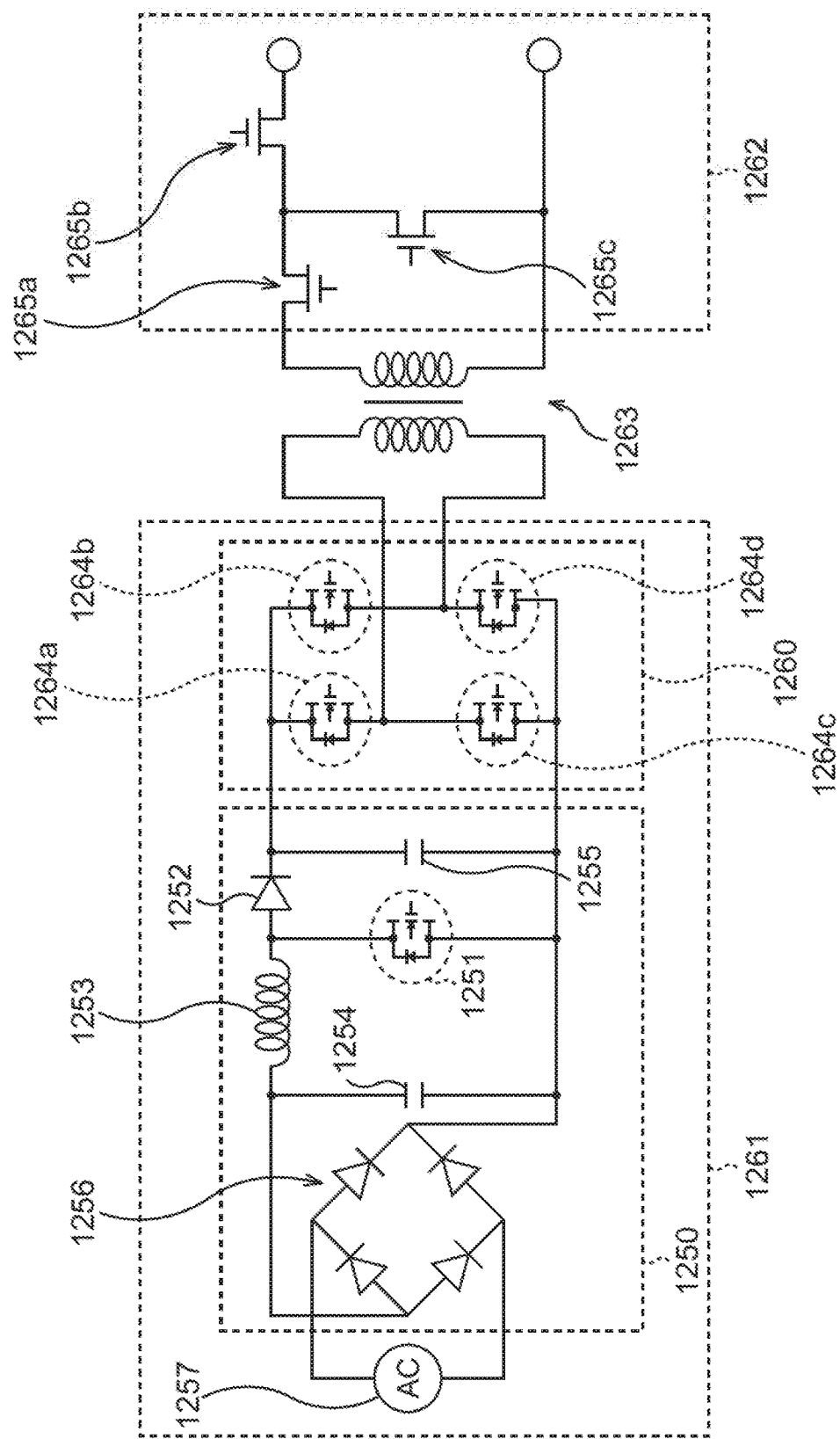
FIG. 10 is a wiring diagram illustrating a power supply apparatus according to a sixth embodiment.

Next, a sixth embodiment is described. The sixth embodiment relates to a power supply apparatus equipped with a compound semiconductor device which includes a nitride semiconductor HEMT. FIG. 10 is a wiring diagram illustrating the power supply apparatus according to the sixth embodiment.

The power supply apparatus includes a high-voltage, primary-side circuit 1261, a low-voltage, secondary-side circuit 1262, and a transformer 1263 arranged between the primary-side circuit 1261 and the secondary-side circuit 1262.

The primary-side circuit 1261 includes the PFC circuit 1250 according to the fifth embodiment, and an inverter circuit, which may be a full-bridge inverter circuit 1260, for example, connected between both terminals of the capacitor 1255 in the PFC circuit 1250. The full-bridge inverter circuit 1260 includes a plurality of (four, in the embodiment) switching elements 1264a, 1264b, 1264c and 1264d.

The secondary-side circuit 1262 includes a plurality of (three, in the embodiment) switching elements 1265a, 1265b and 1265c.

In the embodiment, the compound semiconductor device according to any one of the first to third embodiments is used for the switching element 1251 of the PFC circuit 1250, and for the switching elements 1264a, 1264b, 1264c and 1264d of the full-bridge inverter circuit 1260. The PFC circuit 1250 and the full-bridge inverter circuit 1260 are components of the primary-side circuit 1261. On the other hand, a silicon-based general MIS-FET (field effect transistor) is used for the switching elements 1265a, 1265b and 1265c of the secondary-side circuit 1262.

(Seventh Embodiment)

Figure 11:
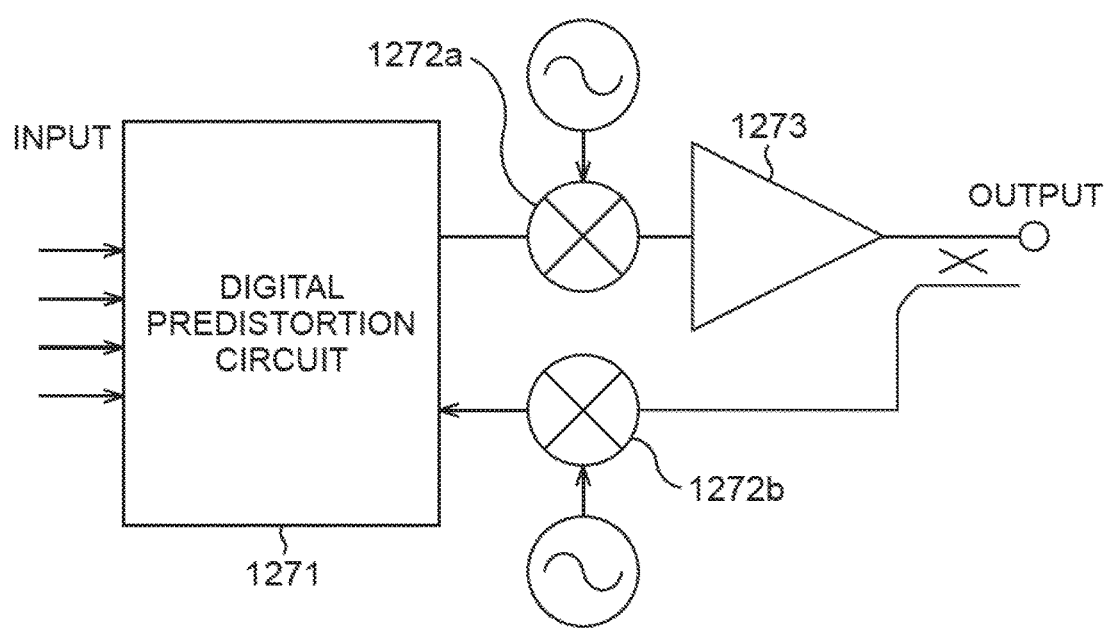
FIG. 11 is a wiring diagram illustrating an amplifier according to a seventh embodiment.

Next, a seventh embodiment is explained. The seventh embodiment relates to an amplifier equipped with the compound semiconductor device which includes a nitride semiconductor HEMT. FIG. 11 is a wiring diagram illustrating the amplifier according to the seventh embodiment.

The amplifier includes a digital predistortion circuit 1271, mixers 1272a and 1272b, and a power amplifier 1273.

The digital predistortion circuit 1271 compensates non-linear distortion in input signals. The mixer 1272a mixes the input signal having the non-linear distortion already compensated, with an AC signal. The power amplifier 1273 includes the compound semiconductor device according to any one of the first to third embodiments, and amplifies the input signal mixed with the AC signal. In the embodiment, the signal on the output side may be mixed, upon switching, with an AC signal by the mixer 1272b, and may be sent back to the digital predistortion circuit 1271. The amplifier may be used as a high-frequency amplifier or a high-output amplifier. The high-frequency amplifier may be used for a transmitting and receiving apparatus for cellar-phone base station, a radar apparatus, or a micro-wave generating apparatus.

The composition of each of the compound semiconductor layers is not limited, and a nitride semiconductor such as GaN, AlN, and InN is usable, for instance. A mixed crystal of these is also usable. The fourth insulating film need not include the silicon nitride film or the silicon oxynitride film.

In any of the embodiments, the substrate may be a silicon carbide (SiC) substrate, a sapphire substrate, a silicon substrate, a GaN substrate, a GaAs substrate, or the like. The substrate may be conductive, semi-insulative, or insulative.

The structures of the gate electrode, the source electrode, and the drain electrode are not limited to those in the above-described embodiments. For example, they each may be formed of a single layer. Further, a method of forming them is not limited to the lift-off method. Moreover, the heat treatment after the formation of the source electrode and the drain electrode may be dispensed with, provided that the ohmic characteristics can be obtained. The gate electrode may contain Pd and/or Pt in addition to Ni and Au.

According to the above-described compound semiconductor device and so on, owing to the appropriate first to third insulating films included therein, it is possible to obtain excellent high-frequency characteristics while reducing electric field concentration.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A compound semiconductor device comprising:
   a carrier transit layer;
   a carrier supply layer over the carrier transit layer;
   a source electrode and a drain electrode above the carrier supply layer;
   a gate electrode above the carrier supply layer between the source electrode and the drain electrode; and
   a first insulating film, a second insulating film, and a third insulating film above the carrier supply layer between the gate electrode and the drain electrode, wherein
   the gate electrode includes a portion above the third insulating film,
   a first concentration of electron traps in the first insulating film is higher than a second concentration of electron traps in the second insulating film,
   a third concentration of electron traps in the third insulating film is higher than the second concentration of the electron traps in the second insulating film, and
   the third insulating film has a lamer size than the first insulating film in planar view.

2. The compound semiconductor device according to claim 1, wherein
   the first insulating film is a first aluminum oxide film,
   the third insulating film is a second aluminum oxide film, and
   a second ratio of a number of oxygen atoms contained in aluminum hydroxide to a number of oxygen atoms that form an Al—O—Al bond out of oxygen atoms in the second aluminum oxide film is higher than a first ratio of a number of oxygen atoms contained in aluminum hydroxide to a number of oxygen atoms that form an Al—O—Al bond out of oxygen atoms in the first aluminum oxide film.

3. The compound semiconductor device according to claim 1, wherein the third insulating film includes a portion on a side of the first insulating film.

4. The compound semiconductor device according to claim 1, wherein the second insulating film includes a silicon nitride film or a silicon oxynitride film, or both of them.

5. A power supply apparatus, comprising
   a compound semiconductor device, wherein the compound semiconductor device comprises:
   a carrier transit layer;
   a carrier supply layer over the carrier transit layer;
   a source electrode and a drain electrode above the carrier supply layer;
   a gate electrode above the carrier supply layer between the source electrode and the drain electrode; and
   a first insulating film, a second insulating film, and a third insulating film above the carrier supply layer between the gate electrode and the drain electrode, wherein
   the gate electrode includes a portion above the third insulating film,
   a first concentration of electron traps in the first insulating film is higher than a second concentration of electron traps in the second insulating film,
   a third concentration of electron traps in the third insulating film is higher than the second concentration of the electron traps in the second insulating film, and
   the third insulating film has a larger size than the first insulating film in planar view.

6. An amplifier, comprising
   a compound semiconductor device, wherein the compound semiconductor device comprises:

a carrier transit layer;
a carrier supply layer over the carrier transit layer;
a source electrode and a drain electrode above the carrier supply layer;
a gate electrode above the carrier supply layer between the source electrode and the drain electrode; and
a first insulating film, a second insulating film, and a third insulating film above the carrier supply layer between the gate electrode and the drain electrode, wherein
the gate electrode includes a portion above the third insulating film,
a first concentration of electron traps in the first insulating film is higher than a second concentration of electron traps in the second insulating film,
a third concentration of electron traps in the third insulating film is higher than the second concentration of the electron traps in the second insulating film, and
the third insulating film has a larger size than the first insulating film in planar view.

7. A method of manufacturing a compound semiconductor device comprising:
forming a carrier supply layer over a carrier transit layer;
forming a source electrode and a drain electrode above the carrier supply layer;
forming a gate electrode above the carrier supply layer between the source electrode and the drain electrode; and
forming a first insulating film, a second insulating film, and a third insulating film above the carrier supply layer between the gate electrode and the drain electrode, wherein
the gate electrode includes a portion above the third insulating film,
a first concentration of electron traps in the first insulating film is higher than a second concentration of electron traps in the second insulating film,
a third concentration of electron traps in the third insulating film is higher than the second concentration of the electron traps in the second insulating film, and
the third insulating film has a larger size than the first insulating film in planar view.

8. The method according to claim 7, wherein
the first insulating film is a first aluminum oxide film,
the third insulating film is a second aluminum oxide film, and
a second ratio of a number of oxygen atoms contained in aluminum hydroxide to a number of oxygen atoms that form an Al—O—Al bond out of oxygen atoms in the second aluminum oxide film is higher than a first ratio of a number of oxygen atoms contained in aluminum hydroxide to a number of oxygen atoms that form an Al—O—Al bond out of oxygen atoms in the first aluminum oxide film.

9. The method according to claim 7, wherein the third insulating film includes a portion on a side of the first insulating film.

10. The method according to claim 7, wherein the second insulating film includes a silicon nitride film or a silicon oxynitride film, or both of them.

* * * * *